(12) United States Patent
Xie et al.

(10) Patent No.: US 9,711,350 B2
(45) Date of Patent: Jul. 18, 2017

(54) METHODS FOR SEMICONDUCTOR PASSIVATION BY NITRIDATION

(71) Applicant: ASM IP Holding B.V., Almere (NL)

(72) Inventors: Qi Xie, Leuven (BE); Fu Tang, Gilbert, AZ (US); Michael Givens, Scottsdale, AZ (US); Petri Raisanen, Gilbert, AZ (US); Jan Willem Maes, Wilrijk (BE)

(73) Assignee: ASM IP HOLDING B.V. (NL)

( * ) Notice: Subject to any disclaimer, the term of this patent is extended or adjusted under 35 U.S.C. 154(b) by 0 days.

(21) Appl. No.: 14/729,510

(22) Filed: Jun. 3, 2015

(65) Prior Publication Data

US 2016/0358772 A1 Dec. 8, 2016

(51) Int. Cl.
*H01L 21/31* (2006.01)
*H01L 21/469* (2006.01)
(Continued)

(52) U.S. Cl.
CPC .... *H01L 21/02247* (2013.01); *H01L 21/0228* (2013.01); *H01L 21/02112* (2013.01);
(Continued)

(58) Field of Classification Search
CPC ......... H01L 21/02247; H01L 21/02205; H01L 21/02249; H01L 21/02255; H01L 21/0228;
(Continued)

(56) References Cited

U.S. PATENT DOCUMENTS 4,354,198 A 10/1982 Hodgson et al.
4,751,200 A 6/1988 Gmitter et al.
(Continued)

FOREIGN PATENT DOCUMENTS

EP 0 265 314 A1 4/1988
EP 2 068 368 A2 6/2009
(Continued)

OTHER PUBLICATIONS

Alian, et al., "Ammonium sulfide vapor passivation of / $In_{0.53}Ga_{0.47}As$ and InP surfaces," Applied Physics Letters, vol. 99, Issue 11, pp. 112114-112114-3, Sep. 2011.
(Continued)

*Primary Examiner* — Stephen W Smoot
*Assistant Examiner* — Vicki B Booker
(74) *Attorney, Agent, or Firm* — Knobbe, Martens, Olson & Bear LLP

(57) ABSTRACT

In some embodiments, a semiconductor surface having a high mobility semiconductor may be effectively passivated by nitridation, preferably using hydrazine, a hydrazine derivative, or a combination thereof. The surface may be the semiconductor surface of a transistor channel region. In some embodiments, a semiconductor surface oxide layer is formed at the semiconductor surface and the passivation is accomplished by forming a semiconductor oxynitride layer at the surface, with the nitridation contributing nitrogen to the surface oxide to form the oxynitride layer. The semiconductor oxide layer may be deposited by atomic layer deposition (ALD) and the nitridation may also be conducted as part of the ALD.

24 Claims, 6 Drawing Sheets

(51) Int. Cl.
*H01L 21/02* (2006.01)
*H01L 29/16* (2006.01)
*H01L 29/20* (2006.01)
*H01L 29/10* (2006.01)
*H01L 21/28* (2006.01)
*H01L 29/51* (2006.01)

(52) U.S. Cl.
CPC .. *H01L 21/02205* (2013.01); *H01L 21/02249* (2013.01); *H01L 21/02255* (2013.01); *H01L 21/02301* (2013.01); *H01L 21/2807* (2013.01); *H01L 29/1033* (2013.01); *H01L 29/16* (2013.01); *H01L 29/20* (2013.01); *H01L 29/518* (2013.01)

(58) Field of Classification Search
CPC ........... H01L 21/02301; H01L 23/3171; H01L 29/1033; H01L 29/16; H01L 29/20
See application file for complete search history.

(56) References Cited

U.S. PATENT DOCUMENTS

| | | |
|---|---|---|
| 5,124,278 A | 6/1992 | Bohling et al. |
| 5,168,077 A | 12/1992 | Ashizawa et al. |
| 5,393,680 A | 2/1995 | Shikata |
| 5,451,542 A | 9/1995 | Ashby |
| 5,616,947 A | 4/1997 | Tamura |
| 5,646,419 A | 7/1997 | McCaldin et al. |
| 5,760,462 A | 6/1998 | Barron et al. |
| 6,071,780 A | 6/2000 | Okamoto et al. |
| 6,112,013 A | 8/2000 | Hsiao et al. |
| 6,117,720 A | 9/2000 | Harshfield |
| 6,126,996 A | 10/2000 | Kirlin et al. |
| 6,150,253 A | 11/2000 | Doan et al. |
| 6,207,976 B1 | 3/2001 | Takahashi et al. |
| 6,248,605 B1 | 6/2001 | Harkonen et al. |
| 6,380,097 B1 | 4/2002 | Dauplaise et al. |
| 6,445,015 B1 | 9/2002 | Braddock |
| 6,534,368 B2 | 3/2003 | Zahorik |
| 6,635,951 B1 | 10/2003 | Zahorik |
| 6,670,651 B1 | 12/2003 | Braddock |
| 6,709,958 B2 | 3/2004 | Li et al. |
| 6,710,423 B2 | 3/2004 | Moore et al. |
| 6,727,192 B2 | 4/2004 | Moore et al. |
| 6,730,547 B2 | 5/2004 | Li et al. |
| 6,734,455 B2 | 5/2004 | Li |
| 6,791,125 B2 | 9/2004 | Demkov et al. |
| 6,812,087 B2 | 11/2004 | Giltom et al. |
| 7,094,651 B2 | 8/2006 | Mitzi et al. |
| 7,094,700 B2 | 8/2006 | Li et al. |
| 7,259,106 B2 | 8/2007 | Jain |
| 7,307,277 B2 | 12/2007 | Frey et al. |
| 7,317,206 B2 | 1/2008 | Kim |
| 7,341,960 B2 | 3/2008 | Lee et al. |
| 7,394,088 B2 | 7/2008 | Lung |
| 7,619,248 B1 | 11/2009 | Cleeves |
| 7,678,708 B2 | 3/2010 | Vaartstra et al. |
| 7,763,727 B2 | 7/2010 | Fujiyama et al. |
| 7,964,490 B2 | 6/2011 | Clendenning et al. |
| 7,972,898 B2 | 7/2011 | Cowdery-Corvan et al. |
| 8,183,559 B2 | 5/2012 | Tsutsui |
| 8,766,330 B2 | 7/2014 | Paranjape et al. |
| 8,796,125 B2 | 8/2014 | Rockenberger et al. |
| 9,478,419 B2 | 10/2016 | Haukka et al. |
| 2002/0041931 A1 | 4/2002 | Suntola et al. |
| 2002/0106849 A1 | 8/2002 | Moore |
| 2005/0257824 A1 | 11/2005 | Maltby et al. |
| 2007/0111429 A1 | 5/2007 | Lung |
| 2008/0006930 A1 | 1/2008 | Ichida |
| 2008/0023703 A1 | 1/2008 | Hoffman et al. |
| 2008/0083924 A1 | 4/2008 | Song et al. |
| 2008/0153039 A1 | 6/2008 | Akimoto |
| 2008/0272355 A1 | 11/2008 | Cho et al. |
| 2009/0179254 A1* | 7/2009 | Van Schaijk .......... G11C 16/14 257/324 |
| 2010/0059820 A1 | 3/2010 | Ohmi et al. |
| 2010/0072451 A1 | 3/2010 | Terao et al. |
| 2010/0159135 A1 | 6/2010 | Bent et al. |
| 2010/0203672 A1 | 8/2010 | Eun et al. |
| 2010/0291299 A1 | 11/2010 | Cameron |
| 2010/0300524 A1 | 12/2010 | Martinson et al. |
| 2011/0006354 A1 | 1/2011 | Jangjian et al. |
| 2011/0124141 A1 | 5/2011 | Goeoetz et al. |
| 2011/0147795 A1 | 6/2011 | Rachmady et al. |
| 2011/0156174 A1 | 6/2011 | Dewey et al. |
| 2013/0157405 A1 | 6/2013 | Cao et al. |
| 2013/0270505 A1 | 10/2013 | Dahmani |
| 2014/0027884 A1 | 1/2014 | Tang et al. |
| 2014/0120738 A1* | 5/2014 | Jung ................. H01L 21/02219 438/778 |
| 2015/0340228 A1* | 11/2015 | Tapily .................. H01L 29/167 257/618 |

FOREIGN PATENT DOCUMENTS

| | | |
|---|---|---|
| JP | H03-278584 | 12/1991 |
| KR | 10-2004-0038514 | 5/2004 |
| WO | WO 97/48499 | 12/1997 |
| WO | WO 02/15285 A1 | 2/2002 |
| WO | WO 03/019691 A2 | 3/2003 |
| WO | WO 2004/032242 A1 | 4/2004 |

OTHER PUBLICATIONS

Alian, et al., "Oxide trapping in InGaAs—$Al_2O_3$ system and the role of sulfur in reducing the $Al_2O_3$ trap density," Electron Device Letters, vol. 33, Issue 11, pp. 1544-1546, Sep. 21, 2012.

Brennan, B.Sc., "Surface and interface characterization of high-k dielectric materials on silicon and III-V semiconductor substrates," Dublin City University, School of Physical Sciences, Dec. 2009.

Genevee, et al. "Atomic layer deposition of zinc indium sulfide films: Mechanistic studies and evidence of surface exchange reactions and diffusion processes," Journal of Vacuum Science & Technology A., vol. 31, Issue 1, Jan./Feb. 2013.

Hsueh, C., "Alternative Materials for Next-Generation Transistors: High-k/Ge based MOSFET", A dissertation submitted to the Graduate School-New Brunswick Rutgers, 2008, 139 pages.

Ihanus, et al., "Atomic Layer Deposition of SrS and BaS Thin Films Using Cyclopentadienyl Precursors," Chemistry of Materials, vol. 14, Issue 5, pp. 1937-1944, May 2002.

Kukli, et al., "Controlled Growth of Yttrium Oxysulphide Thin Films by Atomic Layer Deposition," Materials Science Forum, vols. 315-317, pp. 216-221, dated 1999.

Leskela et al., "Atomic layer deposition (ALD): from precursors to thin film structures", Thin Solid Firms, vol. 409, (2002), pp. 138-146.

Lin, J., "Low Resistance Contacts to N-Type Germanium", A dissertation submitted to the Department of Electrical Engineering, Jun. 2013, 136 pages.

Misra, "High k dielectrics on High-Mobility Substrates: The Interface!" The Electrochemical Society, pp. 47-51, Winter 2011.

O'Connor, et al., "A systematic study of $(NH_4)_2S$ passivation (22%, 10%, 5%, or 1%) on the interface properties of $Al_2O_3$/$In_{0.53}Ga_{0.47}As$/ InP system for $n$-type and $p$-type $In_{0.53}Ga_{0.47}As$ epitaxial layers," Journal of Applied Physics, vol. 109, Issue 2, pp. 024101-024101-10, dated 2011.

O'Connor, et. al., "Analysis of the minority carrier response of n-type and p-type Au/ Ni/ Al2O3/In0.53Ga0.47/InP capacitors following an optimized (NH4)2S treatment," Applied Physicas Letters, vol. 99, Issue 21, pp. 212901-212901-3, dated 2011.

International Search Reporting for International Application No. PCT/US2014/066316, Notification mailed Mar. 3, 2015.

International Search Report and Written Opinion for International Application No. PCT/US2014/066310, Notification mailed Sep. 2, 2015.

(56) References Cited

OTHER PUBLICATIONS

U.S. Patent Application entitled "Method for Forming Metal Chalcogenide Thin Films on a Semiconductor Device" as U.S. Appl. No. 14/741,249, filed Jun. 16, 2015.

* cited by examiner

METHODS FOR SEMICONDUCTOR PASSIVATION BY NITRIDATION

BACKGROUND

Field

This disclosure relates generally to semiconductor processing and, more particularly, to passivation of semiconductor substrates, including passivation of channel regions of transistors.

Description of the Related Art

Semiconductor materials that exhibit high charge-carrier mobility have gained interest as possible materials for use in various electronic devices, such as transistors in integrated circuits. High charge-carrier mobility materials have a higher charge-carrier mobility than silicon, and may improve the performance of these electronic devices, relative to forming the devices using silicon as the only semiconductor. Examples of high charge-carrier mobility semiconductor materials include silicon germanium, germanium and group III-V semiconductor materials, such as GaAs, InP, InGaAs, InAs, and GaSb.

The passivation of semiconductor materials can improve the electrical properties of devices formed with these materials, and may also improve the physical properties and physical stability of those materials, which can provide benefits for device reliability. For example, passivating the surface of a transistor channel region before forming a gate dielectric can improve the performance of the resulting transistor. However, the passivation of high mobility semiconductors faces various challenges and work continues on developing suitable passivation techniques for these materials.

SUMMARY

In some embodiments, a method for integrated circuit fabrication is provided. The method comprises passivating the surface of a substrate comprising a high mobility semiconductor by removing native semiconductor oxide from the surface; subsequently forming a semiconductor oxide-containing film on the surface; and thermally nitriding the semiconductor oxide-containing film by exposing the semiconductor oxide-containing film to at least one of hydrazine and a hydrazine derivative.

In some other embodiments, a method for integrated circuit fabrication is provided. The method comprises providing a transistor channel region having an exposed semiconductor surface, and passivating the exposed semiconductor surface by nitriding the exposed semiconductor surface using a nitrogen precursor comprising at least one of hydrazine and a hydrazine derivative.

DETAILED DESCRIPTION

Figure 1:
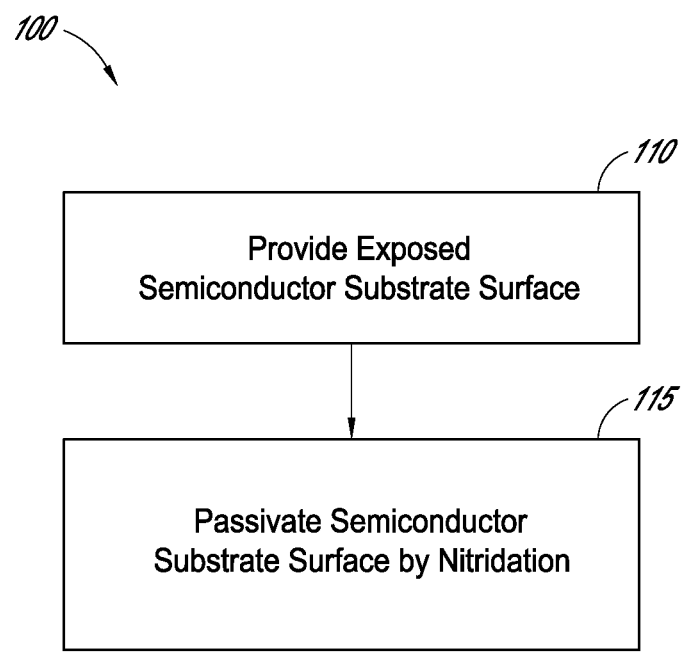
FIG. 1 is a flow chart generally illustrating a process for semiconductor passivation, according to some embodiments.

Various approaches have been proposed for passivating semiconductors having high charge-carrier mobility (also referred to as high mobility semiconductors), but these approaches have been found to have significant drawbacks. Passivation of a channel region surface using deposited silicon is one approach that has been developed for p-doped germanium-based MOSFETs. However, this approach may have a high cost and low throughput since it relies on a low temperature epitaxial deposition process, and may also have an undesirable inversion thickness and conformality issues, particularly in FinFET/vertical nanowire devices. In addition, without being limited by theory, passivation using silicon is not believed to be suitable for n-doped germanium transistor devices due to a high interface state density (Dit) at the germanium conduction band edge, as well as having no electron confinement for silicon with respect to germanium.

The atomic layer deposition (ALD) of $GeO_2$ has been proposed as another approach for forming a passivation layer for germanium transistor devices, and may also be suitable for CMOS devices by providing low Dit for both p-doped and n-doped germanium devices. However, the physical instability of $GeO_2$ may not be compatible with process flows for fabricating transistors. In addition, $GeO_2$ exhibits undesirably high oxide trap density and may cause device reliability issues.

In accordance with some embodiments, a semiconductor surface having a high mobility semiconductor may be effectively passivated by nitridation, preferably using hydrazine, a hydrazine derivative, or a combination thereof. More preferably, the passivation is accomplished by forming a semiconductor oxynitride layer on the surface, with the oxynitride layer formed by nitridation using hydrazine, a hydrazine derivative, or a combination thereof. The surface may be the surface of a transistor channel region.

In some embodiments, the surface of the high mobility semiconductor has a semiconductor oxide-containing film or layer (e.g., a surface oxide), which may be nitrided to form an oxynitride compound. For example, a semiconductor oxide-containing film may be formed by oxidizing the semiconductor surface, by deposition of a semiconductor oxide-containing film on and in contact with the semiconductor surface, or a combination thereof. Preferably, the semiconductor oxide-containing film is deposited by atomic layer deposition (ALD). As used herein, a semiconductor oxide-containing film is a film or layer that comprises the oxide of a semiconductor.

In some other embodiments, a semiconductor oxynitride compound is deposited on the high mobility semiconductor. For example, the semiconductor oxynitride may be deposited by ALD, using temporally-separated pulses of a semiconductor precursor, an oxygen precursor, and a nitrogen precursor.

In some embodiments, a gate stack is formed over the passivated high mobility semiconductor and the semiconductor oxynitride layer may be an interface layer or interlayer disposed, for example, between the semiconductor substrate and a dielectric layer, e.g., a gate dielectric layer. In some embodiments, the semiconductor oxynitride layer forms a part of the gate stack.

Advantageously, passivation by nitridation using hydrazine or its derivatives can provide various benefits. In some embodiments, such nitridation (e.g., nitridation of germanium substrates) can provide exceptionally low oxide trap density levels. In some embodiments, using such nitridation (e.g., nitridation of germanium substrates) to form a nitrogen containing layer (e.g., a semiconductor oxynitride) can provide both low oxide trap densities and low Dit. The nitrogen containing layer is highly stable, which advantageously can provide good device reliability.

Reference will now be made to the Figures Like numerals refer to like features throughout.

FIG. 1 is a flow chart generally illustrating a process 100 for semiconductor passivation, according to some embodiments. At block 110, an exposed semiconductor substrate surface is provided. The exposed semiconductor surface may be part of a semiconductor substrate. As used herein, it will be appreciated that a semiconductor substrate is a substrate that is at least partially formed of semiconductor material. For example, in some embodiments, the semiconductor substrate may be a semiconductor wafer, or may be a semiconductor wafer having overlying conductive and/or dielectric materials.

Preferably, the exposed semiconductor substrate surface comprises a high mobility semiconductor. In some embodiments, the semiconductor at the exposed surface comprises germanium, silicon germanium, a group III-V semiconductor, a group II-VI semiconductor, or a 2D material such as MoS and graphene. In some embodiments, the semiconductor comprises InGaAs. Other suitable substrate surfaces include, GaAs, InP, InAs, and GaSb. In some embodiments the substrate may be a 300 mm or a 450 mm wafer. In some embodiments, the substrate surface comprises multiple materials, including multiple semiconductor materials.

The exposed surface may include the surface of a channel region of a transistor. The transistor may be, for example, a planar transistor, or may be a non-planar transistor, including a FinFET device or a vertical nanowire/gate-all-around (GAA) device. In some embodiments, the transistors may be implemented as part of a complementary metal oxide semiconductor (CMOS) type integrated circuit. These CMOS integrated circuits utilize transistors having different doping types. For example, the transistors may be formed in pairs, with one member of each pair having a channel region that is N-doped, and another member of the pair having a channel region that is P-doped. It will be appreciated that the exposed surface may extend horizontally, vertically, or at an angle.

With continued reference to FIG. 1, the exposed semiconductor substrate surface provided at block 110 is preferably substantially oxygen free. In some embodiments, at block 110, the substantially oxygen-free substrate surface is formed by subjecting the substrate to a native oxide removal process, to remove native oxide of the substrate surface.

At block 115, the exposed semiconductor substrate surface is passivated by nitridation. In some embodiments, the semiconductor surface is exposed to a nitrogen precursor, which reacts with the surface to form a nitrogen-containing film at the surface. Preferably, the nitrogen precursor is hydrazine ($N_2H_4$), a hydrazine derivative or variant, or a combination thereof. Examples of hydrazine variants or derivatives include dimethylhydrazine ($Me_2NNH_2$), tert-butylhydrazine (t-BuNHNH$_2$), bis(tertbutylhydrazido)diethylsilane, and bis(N,N-dimethylhydrazido)diethylsilane. The nitrogen precursor exposure is preferably performed for a duration ranging from about 10 seconds to about 5 minutes, more preferably from about 20 seconds to about 2 minutes.

The process temperature during the nitrogen precursor exposure, e.g., the temperature of the substrate, is preferably in the range from about 150° C. to about 400° C., more preferably about 200° C. to about 300° C. The nitrogen precursor exposure may be accomplished by flowing nitrogen precursor into a process chamber into which the substrate is loaded.

In some embodiments, exposing the semiconductor surface to the nitrogen precursor forms a semiconductor oxynitride compound. For example, surface oxide may be formed at the semiconductor surface, e.g., by oxidizing the surface and/or by depositing a semiconductor oxide on and in contact with the surface, and the surface oxide may be nitrided by exposure to the nitrogen precursor, thereby forming the semiconductor oxynitride compound. In some embodiments, as discussed herein, the exposures to a semiconductor precursor, an oxygen precursor, and a nitrogen precursor may be cycled to form a semiconductor oxynitride layer.

Figure 2:
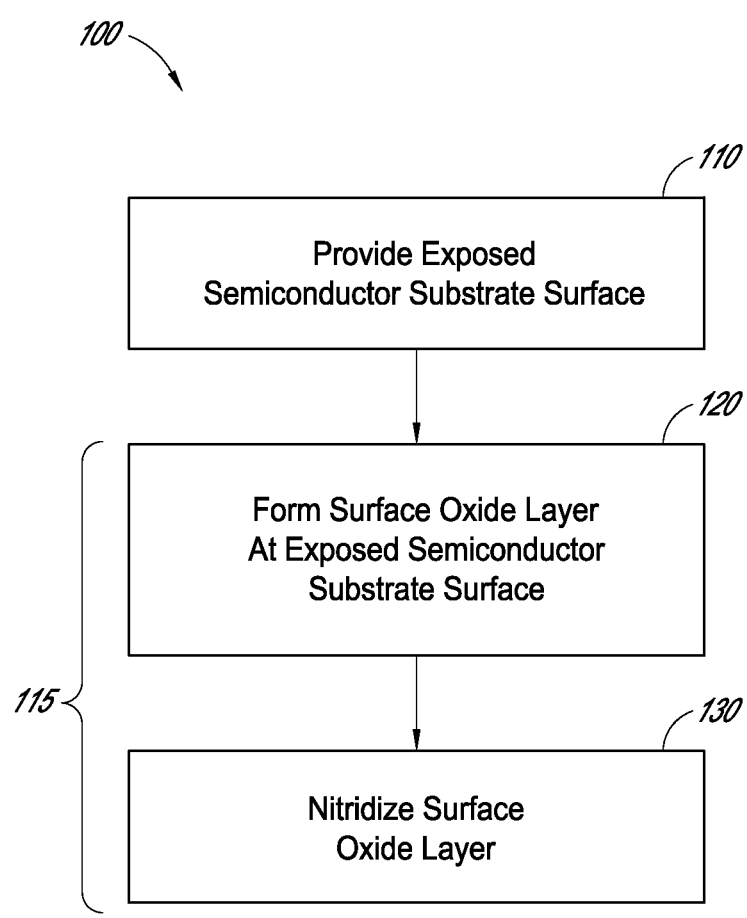
FIG. 2 is a flow chart illustrating further details of some embodiments of the process of FIG. 1.

With reference now to FIG. 2, a flow chart further illustrating details of some embodiments of the process 100 of FIG. 1 is shown. At block 110, an exposed semiconductor surface is provided. The details of block 110 are identical to that for block 110 of FIG. 1, discussed above. For example, in some embodiments the substrate surface may be subjected to a pretreatment process at block 110, which may comprise one or more steps. In the pretreatment, the substrate surface may be exposed to one or more pretreatment reactants and/or to specific conditions, such as temperature or pressure. A pretreatment may be used for any number of reasons including to clean the substrate surface, remove impurities, remove native oxide, and provide desirable surface terminations. Preferably, the pretreatment removes native oxide, to leave a substantially oxygen-free semiconductor surface. In some embodiments, a pretreatment comprises exposing the substrate surface to one or more pretreatment reactant, such as $(NH_4)_2S$, $H_2S$, HCl, HBr, $Cl_2$, HF, or combinations thereof. In some embodiments, such as where a III-V material is used, HCl may be used as the pretreatment reactant. In some embodiments, such as where a germanium substrate is used, HF may be used as the pretreatment reactant. In some embodiments, multiple pretreatment reactants are used sequentially or simultaneously.

With continued reference to FIG. 2, block 115 corresponds to the nitridation block 115 of FIG. 1. However, rather than nitriding the exposed high mobility semiconductor itself, a surface oxide layer is formed and nitrided in the embodiments of FIG. 2. At block 120, an oxide layer is formed on and in contact with the exposed high mobility semiconductor.

In some embodiments, the oxide is preferably a semiconductor oxide, which forms a semiconductor oxide-containing film (which may also be referred to as a semiconductor oxide layer). The semiconductor oxide may be formed by oxidizing the exposed high mobility semiconductor. For example, the substrate may be thermally oxidized by contacting the substrate with oxidant, such as $O_2$, $O_3$, $H_2O$, $H_2O_2$, $N_2O$, NO, $NO_2$, or combinations thereof. It will be appreciated that the thermal oxidation is performed without plasma-activating the oxidant. In some other embodiments, the oxidant may be plasma-activated. Among other things, the duration and temperature of the oxidation may be selected to form an oxide layer of a desired thickness. For example, the thickness of the oxide layer may be about 0.1 nm to about 1.5 nm, preferably about 0.1 nm to about 1.0 nm.

In some other embodiments, the semiconductor oxide layer is formed by a deposition process, including vapor deposition processes such as chemical vapor deposition (CVD). It will be appreciated that, for CVD, the substrate is exposed to mutually reactive precursors that react, e.g. in the gas phase, to deposit a compound comprising elements of those precursors on the substrate. Reaction conditions may be established to decompose the precursors before and/or upon contact with the substrate.

More preferably, the semiconductor oxide layer is deposited by atomic layer deposition (ALD). It will be appreciated that the ALD-type processes for forming the various layers described herein are based on controlled, self-limiting surface reactions and can provide precise control of the film composition and layer thickness, and high conformality. Gas phase reactions are avoided by contacting, or exposing, the substrate alternately and sequentially with reactants. Vapor phase reactants are separated from each other in the reaction chamber, for example, by removing excess reactants and/or reactant byproducts from the reaction chamber between reactant pulses. Removing excess reactants and/or reactant byproducts may be achieved, for example, by purging the reaction space after each pulse of reactant gas using a vacuum and/or a purge gas. A purge gas may also be flowed continuously before, during, and after each pulse of reactant gas. For example, in some embodiments the purge gas may also serve as a carrier gas for one or more of the reactants. In some other embodiments, the alternating reactant exposures may be accomplished by movement of the substrate and/or reactor parts, without stopping and starting the flow of precursors into the deposition chamber to accomplish the alternating exposures. It will be appreciated that, as used herein, an exposure to a particular reactant may also be referred to as a "pulse," and "reactants" may also be referred to as "precursors." Exposure of the substrate to a sequence including each reactant for the deposition constitutes a deposition cycle; for example, where two reactants are utilized, exposing the substrate to a first and then a second reactant can constitute one deposition cycle.

Each reactant pulse is preferably self-limiting. An excess of reactant is supplied during the pulse to saturate the susceptible structure surfaces. In theory, surface saturation ensures reactant occupation of all available reactive sites (subject, for example, to physical size or "steric hindrance" restraints) and thus provides excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide self-limiting behavior and thus maximum conformality. In some embodiments, less than a complete monolayer is deposited in one or more cycles, for example due to steric hindrance. In some embodiments, more than one monolayer may be deposited by, for example, adjusting the deposition conditions to achieve some decomposition reaction, such as would occur in CVD or CVD-like processes. Limited CVD reactions mixed with the self-limiting ALD reactions can raise the deposition rate. The deposition cycles are repeated a desired number of times to form a layer of a desired thickness.

Deposition temperatures are preferably maintained below the precursor thermal decomposition temperature but at a high enough level to avoid condensation of reactants and to provide the activation energy for the desired surface reactions. The appropriate temperature window for any given ALD reaction will depend upon the surface termination and reactant species involved. The reaction temperature for the various atomic layer depositions herein may be in a range from about room temperature to about 500° C., including from about 20° C. to about 500° C., from about 150° C. to about 400° C., from about 200° C. to about 350° C., and from about 250° C. to about 300° C. in some embodiments.

The reaction pressure may be from about 0.1 Torr to about 760 Torr. In some embodiments, the reaction pressure may be from about 0.5 Torr to about atmospheric pressure.

With continued reference to FIG. 2, at block 120, as discussed above, a semiconductor oxide-containing layer is formed. The oxide-containing layer is preferably formed by ALD, by exposing the substrate to temporally separated pulses of a semiconductor precursor and an oxygen precursor. In some embodiments, the semiconductor precursor deposits the same semiconductor as present in the underlying substrate. For example, a germanium precursor may be used to deposit a germanium oxide over an exposed germanium-containing substrate surface.

In some embodiments, the semiconductor precursor may be a semiconductor-organic or a semiconductor halide compound. For example, the semiconductor precursor may be a semiconductor alkoxide or alkylamine. Where the semiconductor is germanium, suitable germanium precursors include a germanium alkoxide (e.g., germanium ethoxide), a germanium alkylamine, germanium chloride, and cyclic germylene.

Upon contacting the substrate, the semiconductor precursor preferably absorbs on the substrate. In some embodiments, the substrate is subsequently exposed to an oxygen precursor, which reacts with the semiconductor precursor to form an oxide of the semiconductor, e.g., germanium oxide. Examples of oxygen precursors include $O_2$, $O_3$, $H_2O$, $H_2O_2$, $N_2O$, NO, $NO_2$, and combinations thereof. In some embodiments, the oxygen precursor is not part of a plasma and forms a thermal oxide with the semiconductor. In some embodiments, the oxygen precursor comprises oxygen radicals, for example oxygen radicals made by plasma. It will be appreciated that sequential and alternating exposure to the semiconductor precursor and an oxygen precursor constitute a deposition cycle, which may be repeated until an oxide layer of a desired thickness is deposited.

With continued reference to FIG. 2, at block 130, the oxide layer is nitrided, by exposing the oxide containing layer to a nitrogen-containing precursor. Preferably, the nitridation is performed as discussed above regarding block 115 of FIG. 1. Preferably, the nitriding is performed thermally, without exposing the nitrogen containing precursor to a plasma or excited species generated from a plasma.

With continued reference to FIG. 2, in some embodiments, blocks 120 and 130 may be performed during an atomic layer deposition that cycles through multiple performances of blocks 120 or 130. In some embodiments, block 130 is performed intermittently during the deposition of the semiconductor oxide layer, and blocks 120 and 130 may be sequentially repeated multiple times. For example, block 130 may alternate with one or more ALD deposition cycles for depositing the semiconductor oxide at block 120, thereby forming a semiconductor oxynitride compound. As a result, the block 115 may be considered to be a semiconductor oxynitride deposition cycle in some embodiments, and block 115 may be repeated until a desired semiconductor oxynitride layer thickness is formed. In some embodiments, each semiconductor oxynitride deposition cycle includes a nitridation step. In some other embodiments, ALD deposition sub-cycles in block 120 for the semiconductor oxide (e.g., GeO deposition cycles) may be alternated with nitridation sub-cycles in bloc 130 that include exposures to a semiconductor precursor and the nitrogen precursor. For example, one or more ALD deposition sub-cycles in block 120 for the semiconductor oxide may be alternated with one or more sub-cycles in block 130 that include exposure to a semiconductor precursor and a subsequent exposure to the nitrogen precursor.

It will be appreciated that for any of the atomic layer depositions herein, the relative ratios of pulses of precursors may deviate from a 1:1 ratio. For example, each deposition cycle or sub-cycle may include one or more pulses of the same precursor. For example, an oxide deposition may include a plurality of semiconductor precursor exposures per one oxygen precursor exposure, or a plurality of oxygen precursor exposures per semiconductor precursor exposure. Similarly, a nitridation may include a plurality of nitrogen precursor exposures per one semiconductor precursor exposure, or a plurality of semiconductor precursor exposures per nitrogen precursor exposure. For example, if increasing the amount of semiconductor or nitrogen in a film is desired, at least one ALD cycle, every other ALD cycle, or every third, fourth, fifth, sixth cycle, etc. could include one or more additional semiconductor or nitrogen precursor pulses, respectively. Similarly, if increasing the amount of oxygen or semiconductor in the semiconductor oxynitride film is desired, at least one ALD cycle, every other ALD cycle, or every third, fourth, fifth, sixth cycle, etc. could include one or more additional oxygen or semiconductor precursor pulses, respectively.

In some embodiments, as discussed herein, the semiconductor oxynitride deposition cycle may include a semiconductor oxide deposition sub-cycle and a semiconductor nitride deposition sub-cycle. For example, the semiconductor oxide deposition sub-cycle may include exposure to a semiconductor precursor and an oxygen precursor (ratios of which may vary, as discussed above), and the semiconductor nitride sub-cycle may include exposure to a semiconductor precursor and a nitrogen precursor (ratios of which may vary, as discussed above). In some embodiments, the ratios of the semiconductor oxide deposition sub-cycle to the semiconductor nitride deposition sub-cycle may vary, for example from about 2:1 to about 1:5.

In addition, the relative ratios of the precursors may vary over the course of the interlayer deposition to form an interlayer with a graded composition. For example, the ratio of semiconductor precursor to oxygen precursor or nitrogen precursor to semiconductor precursor may change with time. In some embodiments, the ratio of the semiconductor oxide deposition sub-cycle 120 to the semiconductor nitride deposition sub-cycle 130 may change with time, e.g., increase with time to form an oxynitride layer with an increasingly higher oxygen concentration with increasing thickness. In some other embodiments, the degree of nitridation may be varied, e.g., by varying the number and/or duration of the pulses of the nitrogen precursor over the course of the deposition of the semiconductor oxynitride layer to form an oxynitride layer with e.g. an increasingly higher nitrogen concentration with increasing thickness.

After the formation of the semiconductor oxynitride layer is completed, various additional layers of material may be formed on the semiconductor oxynitride layer. For example, a dielectric layer, e.g., a high-k dielectric such as $HfO_2$, may be deposited over the interlayer and a conductive gate material may be deposited over the dielectric layer to form a gate stack. In some embodiments, the conductive gate material may be a metal. It will be appreciated that other layers of material may also be provided between the semiconductor oxynitride layer and the dielectric layer, or between the dielectric layer and the conductive gate material, to provide desired physical and/or electrical properties in some embodiments.

Example 1

Hydrazine passivation of germanium was investigated in a metal oxide semiconductor (MOS) capacitor, which has a structure similar to a MOS transistor, except that PN junctions (and source/drain regions) are absent. The germanium was part of a 1.5 µm germanium layer grown epitaxially on a silicon wafer and p-doped. The substrate was then pre-treated by being dipped in HF. The pre-treated p-doped germanium-containing substrate surface was then passivated by exposure to hydrazine in a Pulsar® ALD reactor available from ASM International N.V. of Almere, the Netherlands. The exposure duration was 1 minute, at a process temperature of 250° C. A 2 nm aluminum oxide layer and then a 2 nm hafnium oxide layer were deposited to form a dielectric stack over and contacting the hydrazine-treated surface. Platinum was deposited on the dielectric stack as a gate electrode, thereby forming the MOS capacitor. The platinum was deposited by evaporation, which included depositing platinum dots on one side of the substrate and a blanket platinum layer on the back side. The resulting structure provided a $V_{FB}$ (flat band voltage) of roughly 0.7V, indicating an effective work function for the platinum of about 5.27 eV and low fixed charges.

Figure 3:
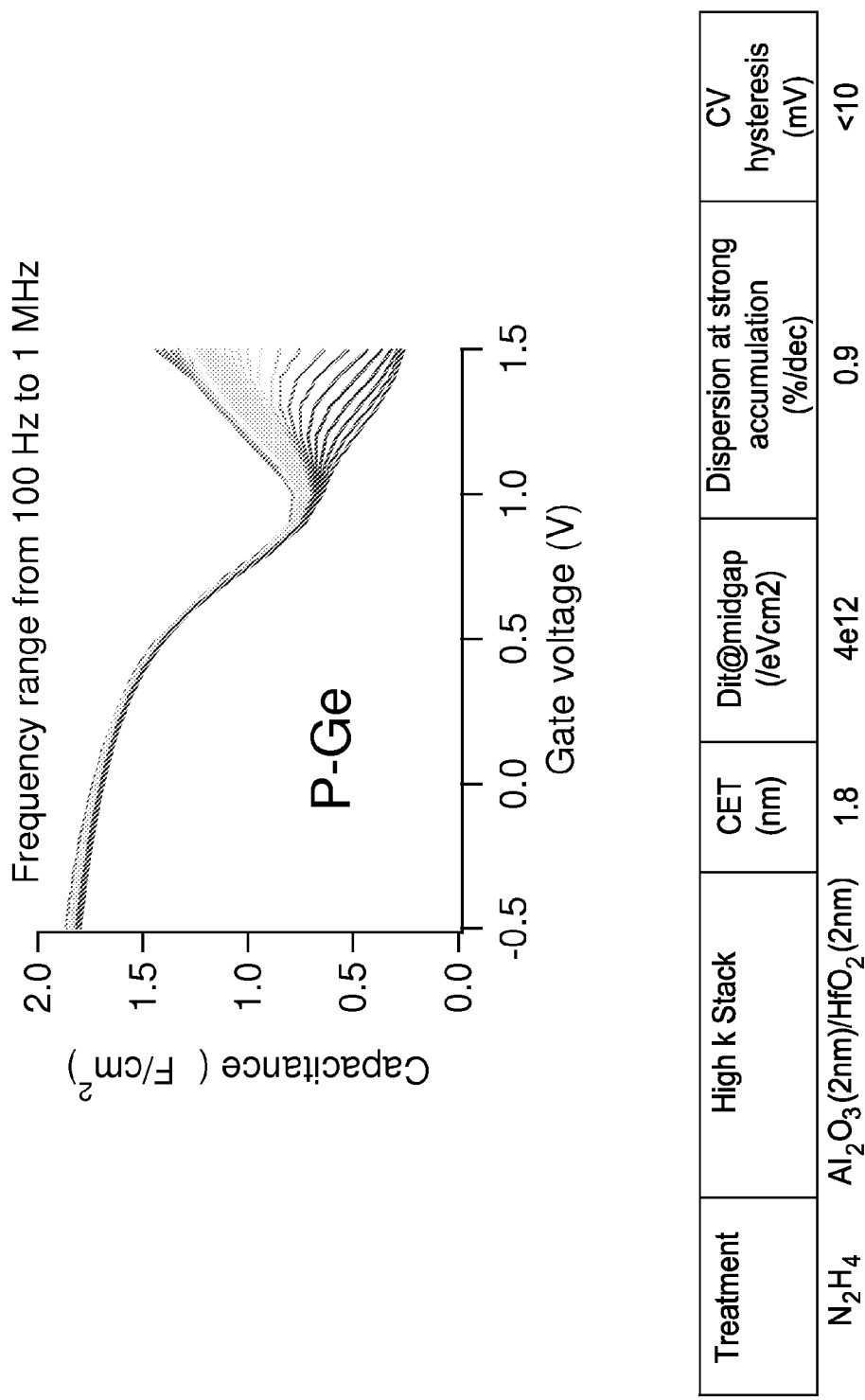
FIG. 3 shows a plot of capacitance vs. voltage with a frequency range from 100 Hz to 1 MHz for a metal oxide semiconductor capacitor having a hydrazine treated germanium surface, according to some embodiments.

FIG. 3 shows a plot of capacitance vs. voltage with a frequency range from 100 Hz to 1 MHz for the metal oxide semiconductor capacitor having the hydrazine treated germanium surface. It will be appreciated that CET is the capacitance effective thickness, which is equal to the effective oxide thickness (EOT) plus a quantum mechanical correction and Dit is the interface state density. As show, the hydrazine treatment resulted in advantageously low Dit, CV dispersion, and CV hysteresis values.

Figure 4A:
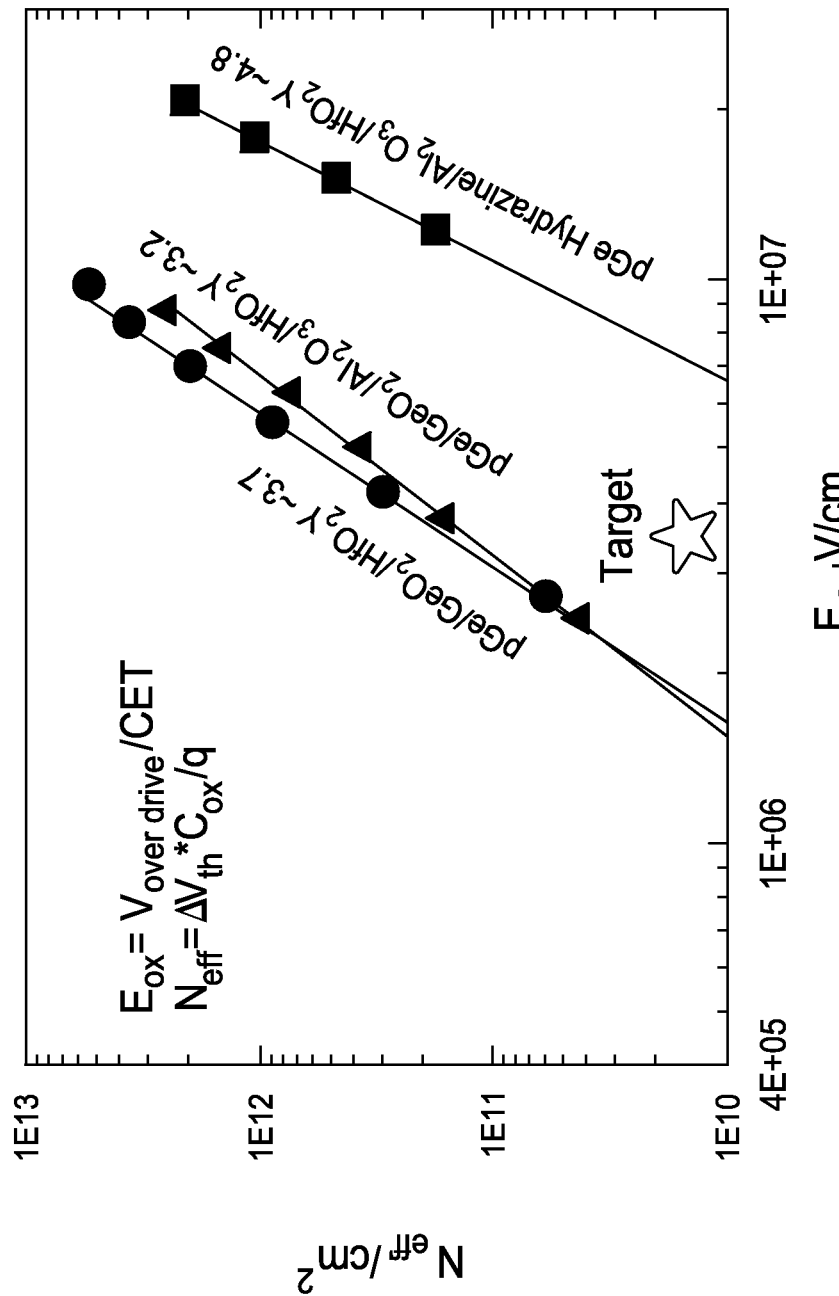
FIGS. 4A and 4B show plots illustrating voltage accelerator gamma and $N_{eff}$, according to some embodiments.

FIG. 4A shows plots illustrating voltage accelerator gamma and $N_{eff}$ (equivalent sheet charge) for the MOS capacitor, formed by a p-doped germanium substrate having a hydrazine treated surface with an overlying dielectric stack of a 2 nm hafnium oxide layer overlying a 2 nm aluminum oxide layer. Included for comparison are values for, from left to right, i) a p-doped germanium substrate having a germanium oxide formed between the substrate and a hafnium oxide layer, and ii) a p-doped germanium substrate having a germanium oxide formed between the substrate and a dielectric stack of a 2 nm hafnium oxide layer overlying a 2 nm aluminum oxide layer. It will be appreciated that the $N_{eff}$ is advantageously low, while the voltage accelerator gamma (γ) (the respective slope of the illustrate lines) is advantageously high for the hydrazine treated germanium substrate. The target was set at $5e10/cm^2$@3.5 MV/cm, which presented a reliability specification for a device able to sustain 0.5V overdrive at 1.4 nm CET. Notably, the hydrazine treated germanium substrate exceeded the target.

Example 2

Passivation of p-doped and n-doped germanium using a germanium oxynitride layer was investigated in a MOS capacitor. As in Example 1, the germanium was part of a 1.5 µm germanium layer grown epitaxially on a silicon wafer and p-doped and n-doped. The substrate was then pre-treated by being dipped in HF. A germanium oxynitride layer was deposited on each of a p-doped and n-doped germanium substrate. The deposition was performed a Pulsar® ALD reactor available from ASM International N.V. of Almere, the Netherlands. The germanium oxynitride interlayer as deposited by ALD using tetrakis(dimethylamino)germanium (TDMAGe) as the germanium precursor, $H_2O$ as the oxygen precursor, and hydrazine ($N_2H_4$) as the nitrogen precursor. Each deposition cycle included the following sequence of pulses:

TDMAGe
$H_2O$
TDMAGe
$N_2H_4$

Ten cycles were performed, with $N_2H_4$ exposure durations of a few second each time. The durations of the precursor pulses and intervening purges were, in order, as follows: TDMAGe—3 s; Purge—4 s; H2O—3 s; Purge—6 s; TDMAGe—3 s; Purge—4 s; N2H4—3 s; Purge—6 s. The deposition cycles were repeated until a layer 1 nm thick was deposited. A 3 nm hafnium oxide layer was next deposited on the germanium oxynitride layer. A platinum gate electrode was then formed on the hafnium oxide layer.

Figure 4B:
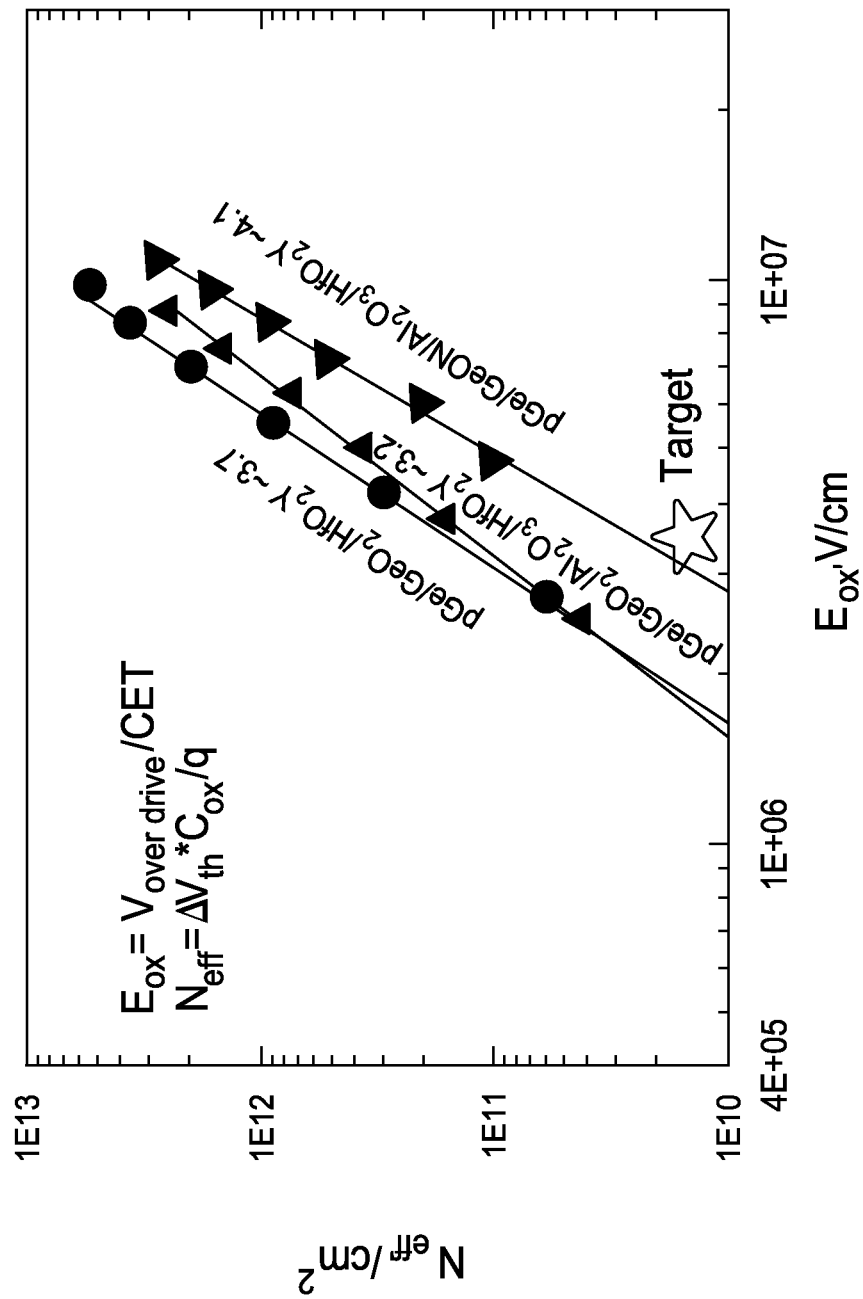

FIG. 4B shows a plot illustrating voltage accelerator gamma and $N_{eff}$ (equivalent sheet charge) for a MOS capacitor formed by a p-doped germanium substrate having a 1 nm ALD germanium oxynitride layer formed between the substrate and a dielectric stack of a 3 nm hafnium oxide layer overlaying a 1 nm aluminum oxide layer. As with Example 1, included for comparison are i) a p-doped germanium substrate having a germanium oxide formed between the substrate and a hafnium oxide layer, and ii) a p-doped germanium substrate having a germanium oxide formed between the substrate and a dielectric stack of a 2 nm hafnium oxide layer overlying a 2 nm aluminum oxide layer. Notably, $N_{eff}$ and gamma ($\gamma$) are both improved over comparison MOS capacitors i) and ii). Although the performance in terms of $N_{eff}$ and gamma ($\gamma$) is lower than for the nitrided pGe surface discussed in Example 1, this performance still meets the target and advantageously has a lower $D_{it}$ value than the sample that had the hydrazine treated p-doped germanium surface. Therefore, the germanium oxynitride provides an advantageous mix of performance parameters. It is expected that adjustments to the process of passivation using hydrazine or a hydrazine derivative could provide further increases in performance.

Figure 5:
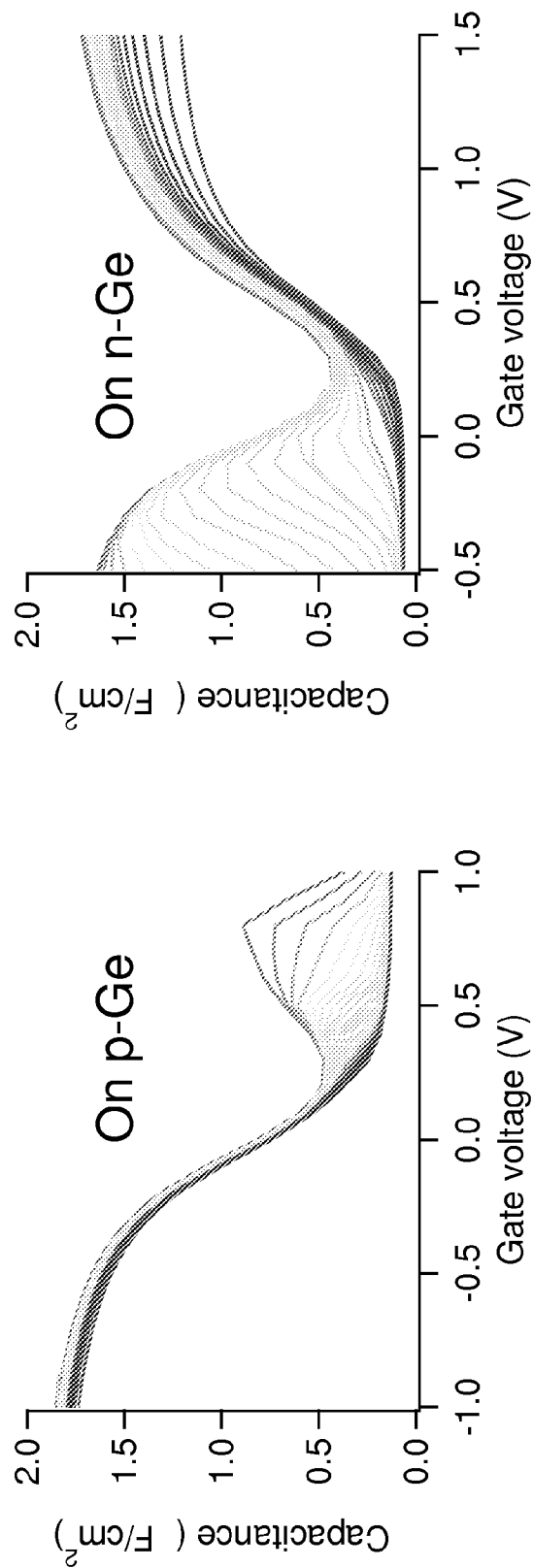
FIG. 5 shows plots of capacitance vs. voltage with a frequency dispersion range from 100 Hz to 1 MHz for hydrazine treated interlayers on p and n-doped germanium substrates, according to some embodiments.

FIG. 5 shows a plot of capacitance vs. voltage with a frequency range from 100 Hz to 1 MHz for the metal oxide semiconductor capacitor using the ALD oxynitride passivation layers described above. Advantageously, compared to an otherwise similar MOS capacitor having a germanium oxide (GeO) interlayer without nitrogen, the germanium oxynitride (GeON) improved $N_{eff}$ by a factor of 3.5 on the p-doped germanium substrate and a factor of 2.5 on the n-doped germanium substrate. A lower $N_{eff}$ is indicative of better stability and reliability. Thus, the GeON layer provided better stability than $GeO_2$. Notably, the GeON layer provided a clear reliability improvement on n-doped germanium substrates compared to a $GeO_2$ baseline reference (~2.5 times lower $N_{eff}$). It will be appreciated that such improvements on n-doped germanium substrates are particularly challenging to achieve.

It will be appreciated by those skilled in the art that various omissions, additions and modifications can be made to the processes and structures described above without departing from the scope of the invention. It is contemplated that various combinations or sub-combinations of the specific features and aspects of the embodiments may be made and still fall within the scope of the description. Various features and aspects of the disclosed embodiments can be combined with, or substituted for, one another in order. All such modifications and changes are intended to fall within the scope of the invention, as defined by the appended claims.

What is claimed is:

1. A method for integrated circuit fabrication, comprising:
   passivating a surface of a substrate, the surface comprising a high-mobility semiconductor, wherein passivating comprises:
   removing native semiconductor oxide from the surface;
   subsequently forming a semiconductor oxide-containing film on the surface, wherein the semiconductor oxide-containing film is an oxide of the high-mobility semiconductor; and
   thermally nitriding the semiconductor oxide-containing film by exposing the semiconductor oxide-containing film to at least one of hydrazine and a hydrazine derivative.

2. The method of claim 1, wherein the surface comprising the high mobility semiconductor is part of a transistor channel region.

3. The method of claim 1, wherein the high mobility semiconductor comprises germanium.

4. The method of claim 3, wherein the germanium is n-doped germanium.

5. The method of claim 1, wherein the high mobility semiconductor comprises a compound semiconductor.

6. The method of claim 5, wherein the compound semiconductor is a group III-V semiconductor.

7. The method of claim 1, wherein nitriding the semiconductor oxide-containing film converts the semiconductor oxide into an oxynitride layer.

8. The method of claim 1, wherein forming the semiconductor oxide-containing film comprises performing an atomic layer deposition, the atomic layer deposition comprising a plurality of deposition cycles, each deposition cycle comprising:
   subjecting the substrate to temporally separated exposures to a semiconductor precursor comprising the high mobility semiconductor and an oxygen precursor.

9. The method of claim 8, wherein forming the semiconductor oxide-containing film and thermally nitriding the semiconductor oxide-containing film are part of a same deposition cycle of the plurality of deposition cycles, wherein each deposition cycle further comprises:
   subjecting the substrate to an exposure to a nitrogen precursor temporally separated from the exposures to the semiconductor precursor and the oxygen precursor.

10. The method of claim 9, wherein subjecting the substrate to an exposure to a nitrogen precursor is part of performing a plurality of deposition subcycles, each subcycle comprising:
    subjecting the substrate to temporally separated exposures to a semiconductor precursor and the nitrogen precursor.

11. The method of claim 10, wherein the semiconductor precursor used in each deposition cycle is the same.

12. The method of claim 9, wherein subjecting the substrate to the exposure to the nitrogen precursor is performed after subjecting the substrate to an exposure to the semiconductor precursor and before subjecting the substrate to an exposure to the oxygen precursor.

13. The method of claim 8, wherein the semiconductor precursor is selected from the group consisting of germanium alkoxides, germanium alkylamines, germanium chlorides, and cyclic germylenes, and combinations thereof.

14. The method of claim 8, wherein the oxygen precursor is selected from the group consisting of $O_2$, $O_3$, $H_2O$, $H_2O_2$, and combinations thereof.

15. The method of claim 1, wherein forming the semiconductor oxide-containing film comprises oxidizing the substrate surface.

16. The method of claim 15, wherein oxidizing the substrate surface comprises exposing the substrate surface to an oxygen plasma or to $H_2O_2$.

17. The method of claim 15, wherein oxidizing the substrate surface comprises exposing the substrate surface to $H_2O_2$.

18. A method for integrated circuit fabrication, comprising:
    providing a transistor channel region having an exposed semiconductor surface; and
    forming a passivation layer comprising a nitride of a same semiconductor species as the exposed semiconductor surface, wherein forming the passivation layer comprises nitriding the exposed semiconductor surface using a nitrogen precursor comprising at least one of hydrazine and a hydrazine derivative.

19. The method of claim 18, wherein nitriding the exposed semiconductor surface forms a semiconductor nitride-containing layer.

20. The method of claim 19, wherein forming the passivation layer comprises exposing the substrate surface to an oxidizing gas and wherein the semiconductor nitride-containing layer is a semiconductor oxynitride-containing layer.

21. The method of claim 18, wherein forming the semiconductor nitride-containing layer comprises performing an atomic layer deposition.

22. The method of claim 21, wherein the atomic layer deposition comprises subjecting the substrate to temporally separated exposures to a semiconductor precursor and an oxygen precursor and wherein the semiconductor nitride-containing layer is a semiconductor oxynitride-containing layer.

23. The method of claim 18, further comprising depositing a gate dielectric layer over the passivated semiconductor surface.

24. The method of claim 18, wherein the exposed semiconductor surface comprises germanium or a group III-V semiconductor, and wherein the passivation layer comprises a compound comprising: nitrogen and germanium, or nitrogen and the group III-V semiconductor.

* * * * *